(12) United States Patent
Tung et al.

(10) Patent No.: US 8,437,129 B2
(45) Date of Patent: May 7, 2013

(54) SERVER CABINET

(75) Inventors: Kai-Yang Tung, Taipei (TW); Chien-An Chen, Taipei (TW)

(73) Assignee: Inventec Corporation, Taipei (TW)

( * ) Notice: Subject to any disclaimer, the term of this patent is extended or adjusted under 35 U.S.C. 154(b) by 68 days.

(21) Appl. No.: 13/110,384

(22) Filed: May 18, 2011

(65) Prior Publication Data

US 2012/0127655 A1 May 24, 2012

(30) Foreign Application Priority Data

Nov. 23, 2010 (TW) ............................. 99140361 A

(51) Int. Cl.
*H05K 7/20* (2006.01)

(52) U.S. Cl.
USPC ............. 361/679.47; 361/679.53; 361/696; 361/699; 165/80.4; 700/300

(58) Field of Classification Search ............ 361/679.46–679.54, 689, 695–703
See application file for complete search history.

(56) References Cited

U.S. PATENT DOCUMENTS

| | | | |
|---|---|---|---|
| 6,819,563 B1 * | 11/2004 | Chu et al. ...................... | 361/696 |
| 6,924,891 B2 | 8/2005 | Karpol et al. | |
| 7,051,802 B2 * | 5/2006 | Baer .............................. | 165/299 |
| 7,233,491 B2 * | 6/2007 | Faneuf et al. ................. | 361/689 |
| 7,522,418 B2 * | 4/2009 | Ishimine ........................ | 361/699 |
| 7,746,634 B2 * | 6/2010 | Hom et al. .................... | 361/679.53 |
| 7,830,657 B2 * | 11/2010 | Chu et al. .................... | 361/679.46 |
| 7,957,132 B2 * | 6/2011 | Fried ............................ | 361/679.47 |
| 8,050,034 B2 * | 11/2011 | Ootani .......................... | 361/696 |
| 2007/0291452 A1 | 12/2007 | Gilliland et al. | |
| 2010/0033931 A1 | 2/2010 | Miyazawa et al. | |
| 2011/0267775 A1 * | 11/2011 | VanDerVeen et al. ........ | 361/692 |
| 2011/0315353 A1 * | 12/2011 | Campbell et al. ........ | 165/104.31 |

* cited by examiner

*Primary Examiner* — Courtney Smith
(74) *Attorney, Agent, or Firm* — WPAT, PC; Justin King

(57) ABSTRACT

A server cabinet is provided, which not only utilizes a first cooling fluid to flow through a heat exchanger of the cabinet to lower the temperature of entrances of fan modules without wasting additional energy, but also utilizes a cooling fluid pipe set to send a second cooling fluid to heat exchange apparatuses in a server to lower the temperature of heating elements inside the cabinet. The server cabinet could lower the heat dissipating loading of the heat exchanger of the cabinet and achieve the efficiency of saving energy.

8 Claims, 3 Drawing Sheets

SERVER CABINET

FIELD OF THE INVENTION

The present invention relates to a server cabinet, and more particularly, to a server cabinet including a cooling fluid pipe set used for allowing the cooling fluid to flow into or out of a heat exchange chamber of a server to cool down a heating source directly.

BACKGROUND OF THE INVENTION

Today, a general computer has been already insufficient to deal with a great deal of data, so people often use a powerful computing system such as server to process the calculation. Besides, because the cloud computing technology is the most popular development trend, the usage quantity of server keeps raising. But when the server operates, a huge amount of heat is generated and causes the overheating issue. In many typical mainframe computers, poor heat dissipation performance is usually the case that cause the computer to malfunction. In addition, taking the power consumed by servers of any common data center for instance, the power used by the heat dissipation system for maintaining the operation of such servers is also twice as much. And not to mention that the complexity of the heat dissipation system for modern cloud data centers that are crowded with servers in high density is generally almost double comparing with those for common data centers. That is, in the enclosed space of a server room of a cloud data center, the heat that all those boxes generate can quickly increase the ambient temperature beyond equipment specifications. The results can be ugly if there is no proper heat dissipation system with good performance available and consequently all distinct possibilities can be caused, such as the operation of the servers may be unstable or even fail, energy can be wasted, the performance of the personnel working in the server room may be poor since an uncomfortable working environment can be resulted, the cost for managing the server room may increase, and so on. In short, how to cool down the server cabinet with a large number of servers is becoming the key issue in modern electronic computing industry.

At present, some server cabinets only use fan to remove heat and lower the temperature, but the premise of using the aforesaid server cabinet is that temperature of the indoor air should be low enough, or it causes the inefficiency of the heat exchange in the server cabinet. Hence, a huge amount of energy is consumed to cool down the indoor temperature when using the aforesaid server cabinet. Other server cabinets utilize heat exchangers to lower the temperature, the heat exchanger could absorb heat generated by servers and cool down the temperature inside the server cabinet by the heat dissipating fins and the phase transformation of the two phase fluid. When two phase fluid flowing through the heat exchanger, it absorbs a huge amount of heat from the heat dissipating fins to vapors. Using the server cabinet with the heat exchangers could save more energy than using the server cabinet with fan only. But because the server cabinet with the heat exchangers removes the heat of the whole cabinet, the loading of the heat exchangers is quite heavy. It needs to consume a great deal of energy to lower the temperature of the two phase fluid and to raise the flow rate of the two phase fluid.

Therefore, it is in need of a server cabinet that can reduce the loading of the heat exchangers and save energy to solve the issues mentioned above.

SUMMARY OF THE INVENTION

The present invention is to provide a server cabinet whose combines a heat exchange device and a cooling fluid pipe set. The temperature of the server cabinet not only could be cooled down by the heat exchange device but also by the cooling fluid pipe set.

In an exemplary embodiment, a server cabinet comprises a casing, a heat exchange device, a cooling fluid pipe set, at least one first pipeline, at least one second pipeline, at least one server and at least one fan module. The casing is configured with a space. The heat exchange device is disposed at the casing and includes a first cooling fluid inlet, a first cooling fluid outlet and a plurality of heat dissipating fins. The first cooling inlet and the first cooling outlet pass through the heat dissipating fins and are used for transporting a first cooling fluid. The cooling fluid pipe set is disposed at one side of the heat exchange device for transporting a second cooling fluid and includes a second cooling fluid inlet, a second cooling fluid outlet and a plurality of connectors disposed at the second cooling fluid inlet and the second cooling fluid outlet. The at least one first pipeline includes a first end and a second end opposite to the first end, and the first end of the first pipeline is connected to one of the plural connectors disposed at the second cooling fluid inlet. The at least one second pipeline includes a first end and a second end opposite to the first end, and the first end of the second pipeline is connected to one of the plural connectors disposed at the second cooling fluid outlet. The at least one server is disposed in the space, and the server includes at least one heating source and at least one heat exchange chamber. The heat exchange chamber is used for exchanging heat with the heating source, and the second end of the first pipeline and the second end of the second pipeline are in communication with the heat exchange chamber respectively. The first pipeline is provided for allowing the second cooling fluid to flow into the heat exchange chamber, and the second pipeline is provided for allowing the second cooling fluid to flow out of the heat exchange chamber. The at least one fan module is disposed at the space between the heat exchange device and the server.

In another exemplary embodiment of the invention, a server cabinet comprises: a casing, a heat exchange device, a cooling fluid pipe set, at least one server and at least one fan module. The casing is configured with a space, and the heat exchange device is disposed at a lateral surface of the casing. The cooling fluid pipe set is disposed at the lateral surface of the casing. The at least one server is disposed at the space and includes at least one heating source and at least one heat exchange chamber. The at least one fan module is disposed between the heat exchange device and the server, wherein the heat exchange device includes a plurality of heat dissipating fins used for exchanging heat with air near a inlet port side of the at least one fan module, and the cooling fluid pipe set is in communication with the heat exchange chamber which is used for exchanging heat with the heating source.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
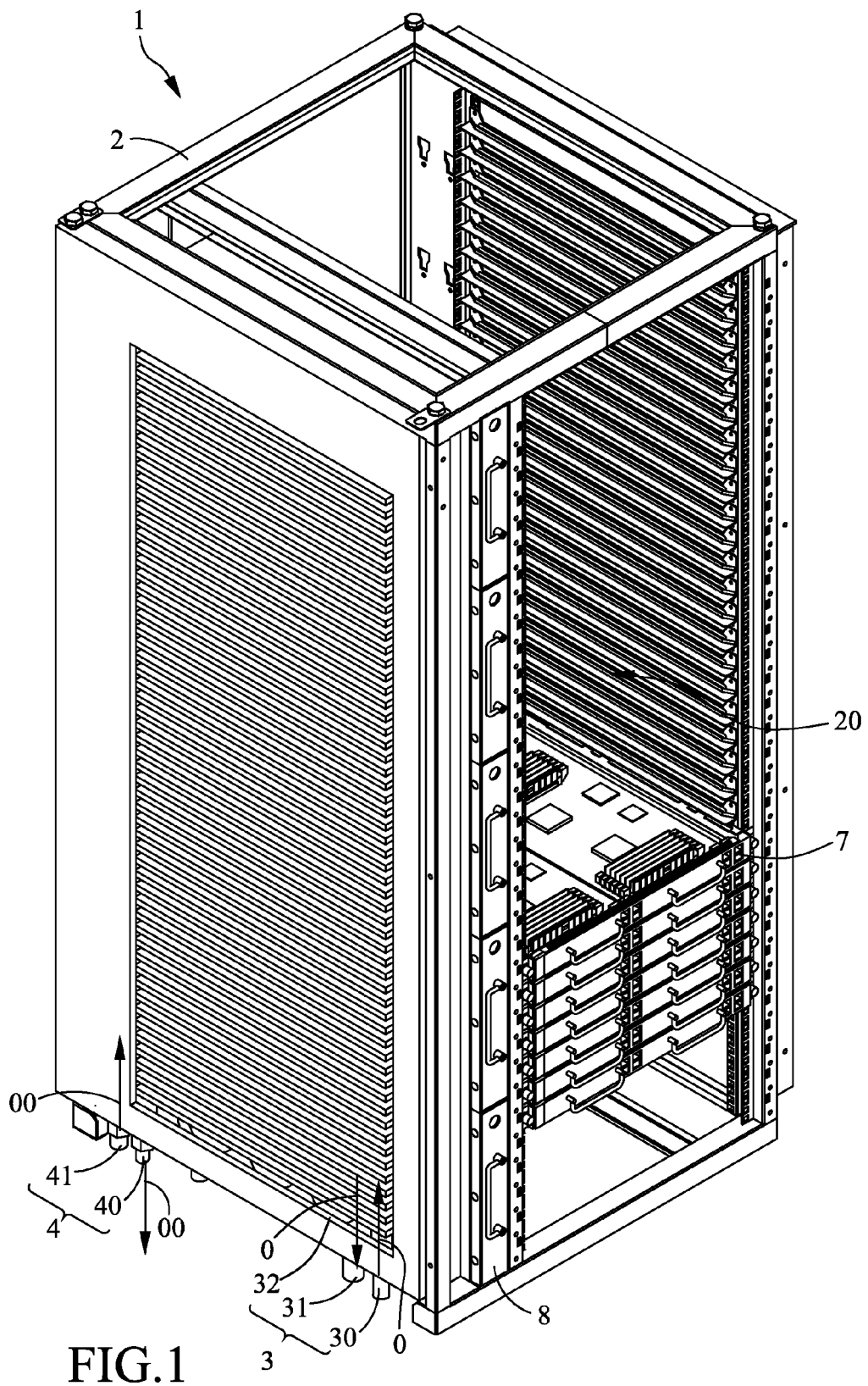
FIG. 1 is a schematic diagram according to the present invention.

Please refer to FIG. 1, which is a schematic diagram according to the present invention. The server cabinet 1 comprises: a casing 2, a heat exchange device 3, a cooling fluid pipe set 4, at least one first pipeline 5, at least one second pipeline 6, at least one server 7, and at least one fan module 8.

The casing 2 is configured with a space 20. The heat exchange device 3 is disposed at the casing 2, and the heat exchange device 3 includes a first cooling fluid inlet 30, a first cooling fluid outlet 31 and a plurality of heat dissipating fins 32. The first cooling inlet 30 and the first cooling outlet 31 pass through the heat dissipating fins 32, and the first cooling inlet 30 and the first cooling outlet 31 are used for transporting a first cooling fluid 0. The plural heat dissipating fins 32 is used for helping dissipate the heat inside the space 20, and the first cooling fluid 0 is used for cooling down the heat dissipating fins 32. In the embodiment, the first cooling fluid 0 is refrigerant or water, but it is not limited thereby.

Figure 2:
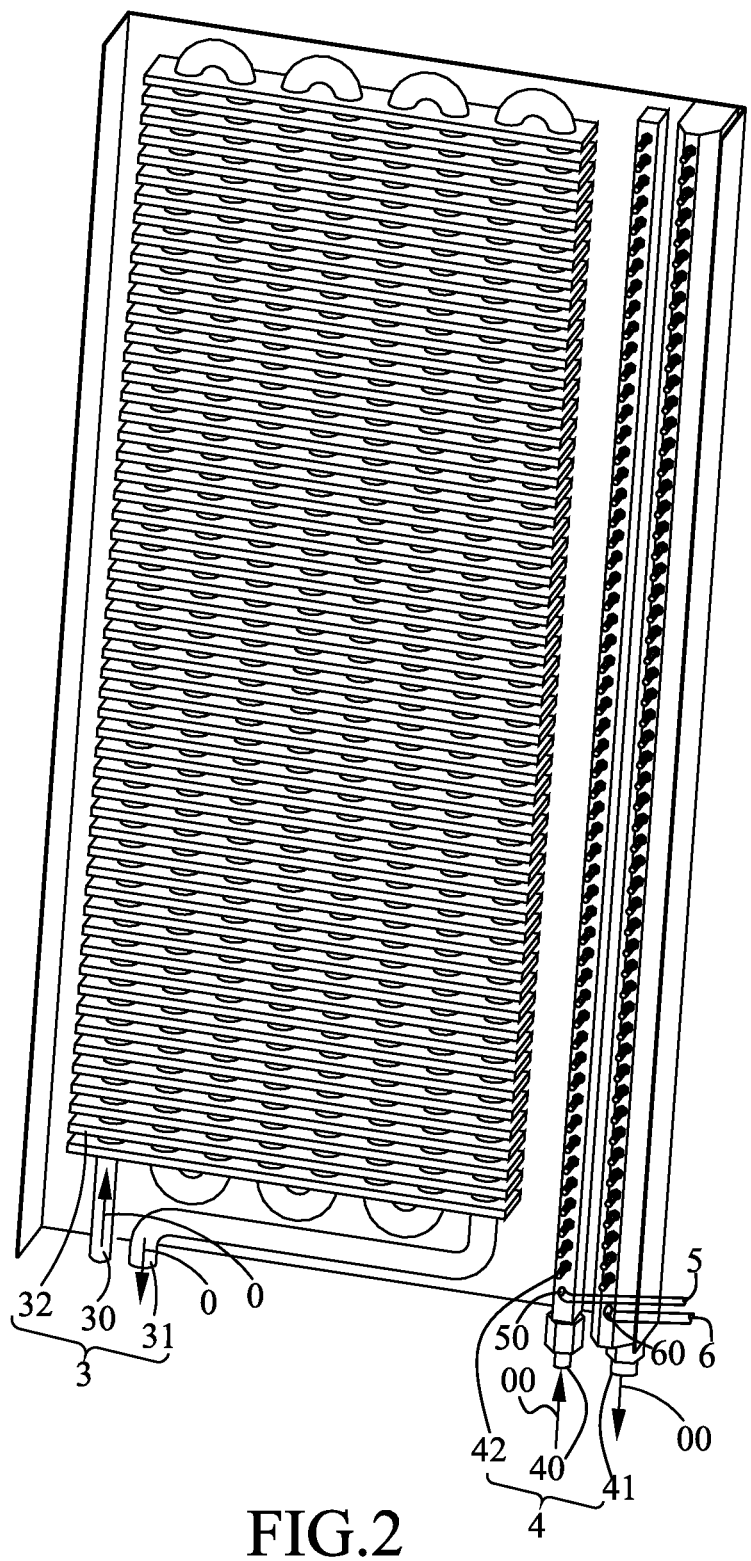
FIG. 2 is a schematic diagram showing a heat exchange device and a cooling fluid pipe set according to the present invention

Please refer to FIG. 2, which is a schematic diagram showing a heat exchange device and a cooling fluid pipe set according to the present invention. In the embodiment, the cooling fluid pipe set 4 is disposed at one side of the heat exchange device 3, and the cooling fluid pipe set 4 includes a second cooling fluid inlet 40 and a second cooling fluid outlet 41 which are used for transporting a second cooling fluid 00. Besides, a plurality of connectors 42 are disposed at the second cooling fluid inlet 40 and the second cooling fluid outlet 41, and the plural connectors 42 are perpendicular to the second cooling fluid inlet 40 and the second cooling fluid outlet 41 respectively. The second cooling fluid 00 is refrigerant or water, but it is not limited thereby. The at least one first pipeline 5 includes a first end 50 and a second end 51 opposite to the first end 50, and the first end 50 of the first pipeline 5 is connected to one of the plural connectors 42 disposed at the second cooling fluid inlet 40. The at least one second pipeline 6 includes a first end 60 and a second end 61 opposite to the first end 60, and the first end 60 of the second pipeline 6 is connected to one of the plural connectors 42 disposed at the second cooling fluid outlet 41. In the embodiment, the connector 42 is quick couplers, but it is not limited thereby.

Figure 3:
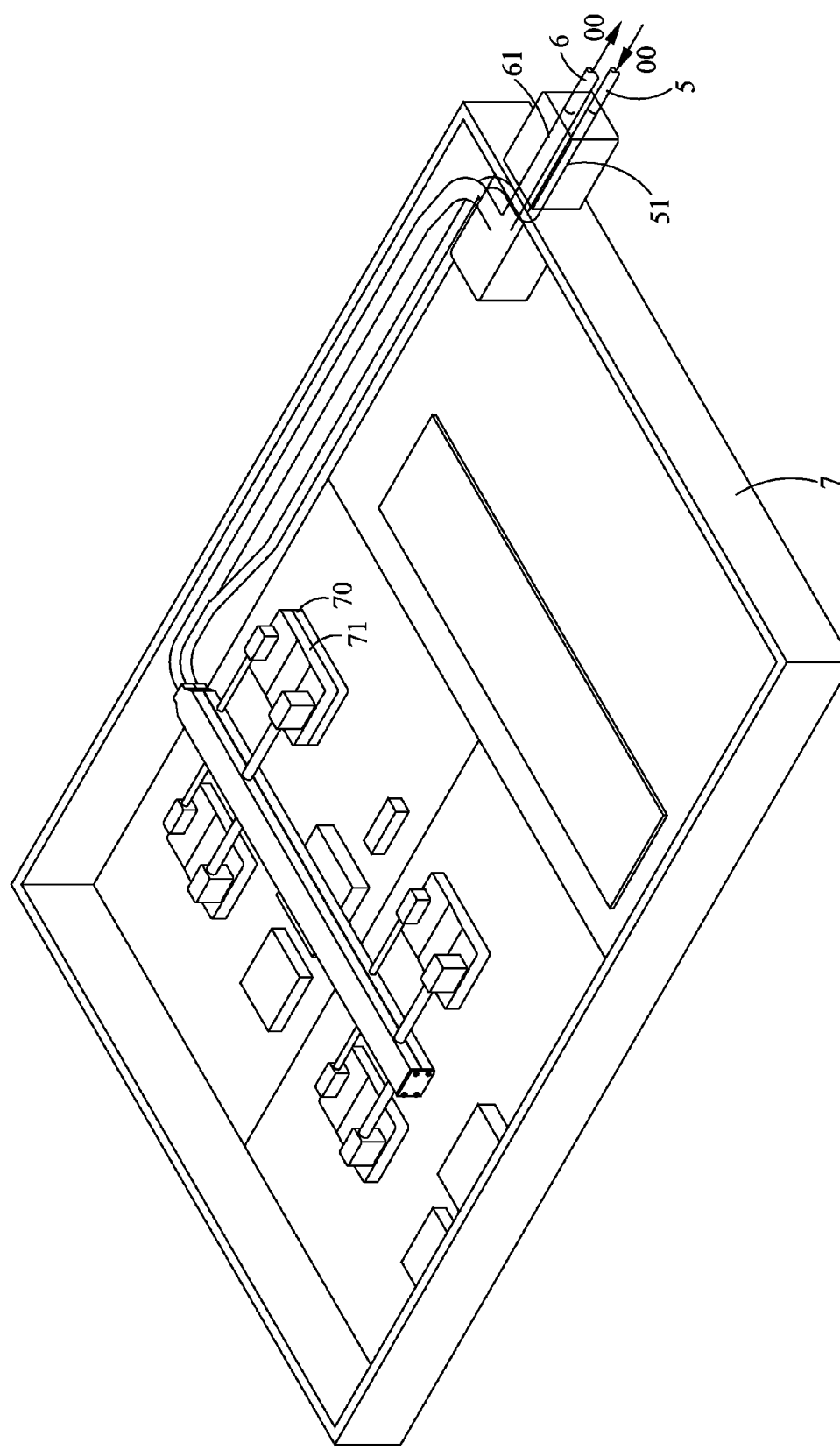
FIG. 3 is a schematic diagram showing a heat exchange device inside a server according to the present invention.

The at least one server 7 is disposed in the space 20. Please refer to FIG. 3, which is a schematic diagram showing a heat exchange device inside a server according to the present invention. The server 7 includes at least one heating source 70 and at least one heat exchange chamber 71. The heat exchange chamber 71 is arranged in thermal contact with the heating source 70 to exchange heat, and the second end 51 of the first pipeline 5 and the second end 61 of the second pipeline 6 are in communication with the heat exchange chamber 71 respectively. The first pipeline 5 is provided for allowing the second cooling fluid 00 to flow into the heat exchange chamber 71 of the server 7 to take the heat generated by the heating source 70 away. The second pipeline 6 is provided for allowing the second cooling fluid 00 to flow out of the heat exchange chamber 71 of the server 7. The amounts of the first pipeline 5 and the second pipeline 6 depend on the amount of the server 7 or that of the heating source 70 inside the server cabinet 1.

The at least one fan module 8 is disposed between the heat exchange device 3 and the servers 7. Because the cooling fluid would be vapored and its' volume would be expanded after adsorbing heat, in the embodiment, the pipe diameter of the second cooling fluid outlet 41 is larger than that of the second cooling fluid inlet 40, the vapored second cooling fluid 00 is easier to discharge from the second cooling fluid outlet 32 with larger pipe diameter, likewise, the pipe diameter of the first cooling fluid outlet 31 is larger than that of the first cooling fluid inlet 30.

The server cabinet 1 utilizes the first cooling fluid 0 flowing from the first cooling fluid inlet 30 to the heat exchange device 3 to exchange heat. After absorbing heat, the first cooling fluid 0 flows out of the heat exchange device 3 through the first cooling fluid outlet 31. The temperature near the inlet port side of the fan module of the server cabinet 1 could be cooled down by the heat exchange device 3, so the server cabinet 1 does not need to be disposed at a room with air conditioning. Besides, the server cabinet 1 utilizes the fan module 8 to enhance the air circulation inside the space 20 and lower the temperature. In addition, the server cabinet 1 further uses the cooling fluid pipe set 4 which includes the first pipeline 5 and the second pipeline 6. The first pipeline 5 is provided for allowing the second cooling fluid 00 to flow into the heat exchange chamber 71 of the server 7, and the second pipeline 6 is provided for allowing the second cooling fluid 00 to flow out of the heat exchange chamber 71 of the server 7 to take the heat generated from the heating source 70 away directly. The heating source 70 is central processing unit or chipset, but it is not limited thereby. Because of the cooling fluid pipe set 4, the server cabinet 1 could reduce the loading of the heat exchange device 3, raise the heat dissipating efficiency and save energy.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A server cabinet, comprising:
  a casing, configured with a space;
  a heat exchange device, disposed at the casing, the heat exchange device including a first cooling fluid inlet, a first cooling fluid outlet and a plurality of heat dissipating fins, the first cooling inlet and the first cooling outlet passing through the heat dissipating fins and transporting a first cooling fluid;
  a cooling fluid pipe set, disposed at one side of the heat exchange device for transporting a second cooling fluid, wherein the cooling fluid pipe set includes a second cooling fluid inlet, a second cooling fluid outlet, and a plurality of connectors, and the plurality of connectors are disposed perpendicular at the second cooling fluid inlet and the second cooling fluid outlet respectively;

at least one first pipeline, including a first end and a second end opposite to the first end, the first end of the first pipeline connected to one of the plural connectors disposed at the second cooling fluid inlet;

at least one second pipeline, including a first end and a second end opposite to the first end, the first end of the second pipeline connected to one of the plural connectors disposed at the second cooling fluid outlet;

at least one server, disposed in the space, the server including at least one heating source and at least one heat exchange chamber, the heat exchange chamber used for exchanging heat with the heating source, the second end of the first pipeline and the second end of the second pipeline being in communication with the heat exchange chamber respectively, the first pipeline provided for allowing the second cooling fluid to flow into the heat exchange chamber, the second pipeline provided for allowing the second cooling fluid to flow out of the heat exchange chamber; and at least one fan module, disposed at the space between the heat exchange device and the server.

2. The server cabinet of claim 1, wherein the pipe diameter of the second cooling fluid outlet is larger than that of the second cooling fluid inlet.

3. The server cabinet of claim 1, wherein the first cooling fluid is refrigerant or water and the second cooling fluid is refrigerant or water.

4. A server cabinet, comprising:

a casing, configured with a space;

a heat exchange device, disposed at a lateral surface of the casing;

a cooling fluid pipe set, disposed at the lateral surface of the casing;

at least one server, disposed at the space, the server including at least one heating source and at least one heat exchange chamber; and at least one fan module, disposed between the heat exchange device and the server;

wherein the heat exchange device includes a plurality of heat dissipating fins used for exchanging heat with air near a inlet port side of the at least one fan module, and the cooling fluid pipe set is in communication with the heat exchange chamber which is used for exchanging heat with the heating source; and wherein the cooling fluid pipe set, disposed at one side of the heat exchange device for transporting a second cooling fluid, and the cooling fluid pipe set includes a second cooling fluid inlet, a second cooling fluid outlet , and a plurality of connectors, and the plurality of the connectors are disposed perpendicular at the second cooling fluid inlet and the second cooling fluid outlet respectively.

5. The server cabinet of claim 4, wherein the heat exchange device further comprises a first cooling fluid inlet and a first cooling fluid outlet which pass through the heat dissipating fins and are used for transporting a first cooling fluid to lower the temperature of the inlet port side of the fan module.

6. The server cabinet of claim 4, wherein the second cooling fluid inlet communicates with the heat exchange chamber through a first pipeline, the second cooling fluid outlet communicates with the heat exchange chamber through a second pipeline, the cooling fluid pipe set transports a second cooling fluid to the heat exchange chamber to lower the temperature of the heating source.

7. The server cabinet of claim 6, wherein the heat exchange chamber is arranged in thermal contact with the heating source.

8. The server cabinet of claim 4, wherein the heating source is central processing unit.

* * * * *